US009385750B2

(12) United States Patent
Norvell et al.

(10) Patent No.: US 9,385,750 B2
(45) Date of Patent: Jul. 5, 2016

(54) SPLIT GAIN SHAPE VECTOR CODING

(71) Applicant: TELEFONAKTIEBOLAGET L M ERICSSON (PUBL), Stockholm (SE)

(72) Inventors: Erik Norvell, Stockholm (SE); Volodya Grancharov, Solna (SE); Tomas Jansson Toftgård, Uppsala (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/440,713

(22) PCT Filed: Nov. 11, 2014

(86) PCT No.: PCT/SE2014/051339
§ 371 (c)(1),
(2) Date: May 5, 2015

(87) PCT Pub. No.: WO2015/072914
PCT Pub. Date: May 21, 2015

(65) Prior Publication Data
US 2016/0036462 A1 Feb. 4, 2016

Related U.S. Application Data

(60) Provisional application No. 61/903,024, filed on Nov. 12, 2013.

(51) Int. Cl.
H03M 7/00 (2006.01)
H03M 7/30 (2006.01)
(Continued)

(52) U.S. Cl.
CPC ........... *H03M 7/3082* (2013.01); *G10L 19/002* (2013.01); *G10L 19/038* (2013.01);
(Continued)

(58) Field of Classification Search
CPC ........... H03M 7/30; H04N 7/50; H04B 1/665; H05K 999/99; G10L 15/08
USPC ............. 341/87; 375/240.01, 240.02, 240.03, 375/240.25; 704/229, 500, 240, 205
See application file for complete search history.

(56) References Cited

U.S. PATENT DOCUMENTS

2005/0015246 A1* 1/2005 Thumpudi .............. G10L 19/24
704/229

OTHER PUBLICATIONS

Kondoz, "Digital Speech: Coding for Low Bit rate Communication Systems", 2005, John Wiley & Sons, XP002737929, pp. 50-52.
(Continued)

*Primary Examiner* — Joseph Lauture
(74) *Attorney, Agent, or Firm* — Rothwell, Figg, Ernst & Manbeck, P.C.

(57) ABSTRACT

The invention relates to an encoder and a decoder and methods therein for supporting split gain shape vector encoding and decoding. The method performed by an encoder, where the encoding of each vector segment is subjected to a constraint related to a maximum number of bits, $B_{MAX}$, allowed for encoding a vector segment. The method comprises, determining an initial number, $Np\_{init}$, of segments for a target vector x; and further determining an average number of bits per segment, $B_{AVG}$, based on a vector bit budget and $Np\_{init}$. The method further comprises determining a final number of segments to be used, for the vector x, in the gain shape vector encoding, based on energies of the $Np\_{init}$ segments and a difference between $B_{MAX}$ and $B_{AVG}$. The performing of the method enables an efficient allocation of the bits of the bit budget over the target vector.

30 Claims, 10 Drawing Sheets

(51) Int. Cl.
*G10L 19/002* (2013.01)
*G10L 19/038* (2013.01)
*G10L 15/08* (2006.01)
*H04N 19/61* (2014.01)
*H04B 1/66* (2006.01)

(52) U.S. Cl.
CPC ............... *G10L 15/08* (2013.01); *H03M 7/30* (2013.01); *H04B 1/665* (2013.01); *H04N 7/50* (2013.01); *H05K 999/99* (2013.01)

(56) References Cited

OTHER PUBLICATIONS

International Search Report cited in PCT/SE2014/051339, dated Apr. 13, 2015, 2 pages.
Written Opinion of the International Preliminary Examining Authority issued in International application No. PCT/SE2014/051339 dated Feb. 1, 2016, 4 pages.

* cited by examiner

000# SPLIT GAIN SHAPE VECTOR CODING

CROSS REFERENCE TO RELATED APPLICATION

This application is a 35 U.S.C. 371 National Phase Entry Application from PCT/SE2014/051339, filed Nov. 11, 2014, which claims the benefit of U.S. Ser. No. 61/903,024 filed on Nov. 12, 2013, the disclosures of which are incorporated herein in their entirety by reference.

TECHNICAL FIELD

The invention disclosed herein generally relates to gain shape vector encoding and decoding, and in particular to split gain shape vector quantization.

BACKGROUND

Encoding methods for e.g. audio and/or video, typically comprise some type of quantization of signal segments. It is known that unconstrained vector quantization (VQ) is a useful quantization method for grouped samples, i.e. vectors, of a certain length. However, the memory and search complexity constraints have led to the development of structured vector quantizers. Different structures give different trade-offs in terms of search complexity and memory requirements. One such conventional method for structured vector quantization is the gain-shape vector quantization, where the target vector x is represented using a shape vector r and a gain G:

$$r = \frac{x}{G}$$

The concept of gain-shape vector quantization is to quantize a pair of gain and shape components $\{r, G\}$ instead of directly quantizing the target vector. The gain and shape components are then encoded using a shape quantizer which is tuned for the normalized shape input, and a gain quantizer which handles the dynamics of the signal. This structure is commonly used in audio coding since the division into dynamics and shape, also denoted fine structure, fits well with the perceptual auditory model.

Further, many audio codecs such as IETF Opus and ITU-T G.719 uses a gain-shape vector quantization to encode the spectral coefficients of the target audio signal. Both these codecs use a fixed band structure to partition the spectrum into multiple segments, and there is no adaptation of the band structure to any changes in the target vector.

One issue with gain shape quantization is to find a suitable vector length. Longer vectors give larger variations within the vector such that the shape quantizer needs to handle the dynamics of the signal. Shorter vectors reduce the dynamics within the vector, but may suffer from the fact the lower dimensionality of the shape VQ has less capability to exploit the sample correlation. In addition, the overhead for gain coding increases as the number of partitions increases, which leaves fewer bits for the for the shape coding.

SUMMARY

It is desired to achieve an efficient gain shape vector encoding and decoding.

According to a first aspect, a method is provided for supporting split gain shape vector encoding. The method is to be performed by a media encoder, where the encoding of each vector segment is subjected to a constraint related to a maximum number of bits, $B_{MAX}$, allowed for encoding a vector segment. The method comprises, determining an initial number, $Np\_{init}$, of segments for a target vector x; and further determining an average number of bits per segment, $B_{AVG}$, based on a vector bit budget and $Np\_{init}$. The method further comprises determining a final number of segments to be used, for the vector x, in the gain shape vector encoding, based on energies of the $Np\_{init}$ segments and a difference between $B_{MAX}$ and $B_{AVG}$.

According to a second aspect, a method is provided for supporting split gain shape vector decoding. The method is to be performed by a media decoder, where a representation of each vector segment of a gain shape vector x is subjected to a constraint related to a maximum number of bits, $B_{MAX}$, allowed for encoding a vector segment. The method comprises determining an initial number of segments, for a vector $x_q$ to be reconstructed. The method further comprises receiving an indication, from a media encoder, of whether an increased number of segments is applied for the vector $x_q$, or not. The method further comprises determining a final number of segments for the decoding of the vector $x_q$ based on the received indication.

According to a third aspect, a media encoder is provided, which is operable to perform split gain shape vector encoding, where the encoding of each vector segment is subjected to a constraint related to a maximum number of bits, $B_{MAX}$, allowed for encoding a vector segment. The media encoder is configured to determine an initial number, $Np\_{init}$, of segments for a target vector x; and to determine an average number of bits per segment, $B_{AVG}$, for the vector x, based on a vector bit budget and $Np\_{init}$. The media encoder is further configured to determine a final number of segments to be used in the gain shape vector encoding based on energies of the $Np\_{init}$ segments and a difference between $B_{MAX}$ and $B_{AVG}$.

According to a fourth aspect, a media decoder is provided, which is operable to perform gain shape vector decoding, where a representation of each vector segment of a gain shape vector x is subjected to a constraint related to a maximum number of bits, $B_{MAX}$, allowed for encoding a vector segment. The media decoder is configured to determine an initial number of segments, $Np\_{init}$, for a vector $x_q$ to be reconstructed; and further to receive an indication, from a media encoder, of whether an increased number of segments is applied for the vector $x_q$, or not. The media decoder is further configured to determine a final number of segments for the decoding of the vector $x_q$ based on the received indication.

According to a fifth aspect, a wireless device is provided, which comprises a media encoder according to the third aspect.

According to a sixth aspect, a wireless device is provided, which comprises a media decoder according to the fourth aspect.

According to a seventh aspect, a computer program is provided, which comprises instructions which, when executed on at least one processor, cause the at least one processor to carry out the method according to the first and/or second aspect.

According to an eighth aspect, a carrier is provided, which contains the computer program of the seventh aspect.

BRIEF DESCRIPTION OF DRAWINGS

The foregoing and other objects, features, and advantages of the technology disclosed herein will be apparent from the following more particular description of embodiments as illustrated in the accompanying drawings. The drawings are

DETAILED DESCRIPTION

A concept of embodiments described herein is to analyze the shape and determine a suitable resolution into sub-vectors, given a target vector of a certain size. This may reduce the quantization error, and increase perceived quality, in case of audio codec. Further, it is an aim of some embodiments described herein to find an optimal number of sections, i.e. number of splits of the target vector.

Figure 1:
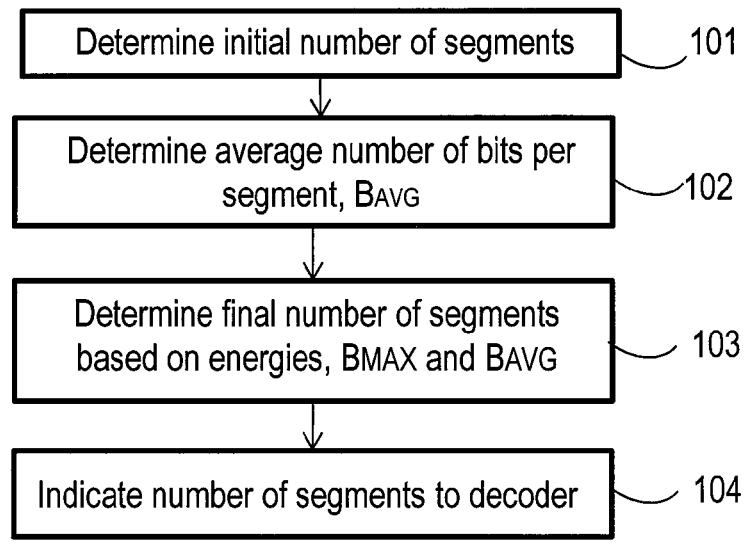
FIGS. 1-2 are flow charts showing methods performed by an encoder according to exemplifying embodiments.

Embodiments herein relate to a method for supporting split gain shape vector encoding. The method is intended to be performed by a media encoder in situations where the encoding of each vector segment is subjected to a constraint related to a maximum number of bits, $B_{MAX}$. That is, in situations where the maximum number of bits allowed for encoding of a vector segment is $B_{MAX}$. This constraint may be due to e.g. processing capacity and/or memory capacity of the media encoder. A method according to an exemplifying embodiment will be described below with reference to FIG. 1. The method illustrated in FIG. 1 comprises, for a target vector x, determining 101 an initial number, $Np\_{init}$, of segments for the target vector x. The number $Np\_{init}$ could be determined based on e.g. $B_{MAX}$ and a bit budget, i.e. the number of bits allocated for encoding the entire vector x. The method further comprises determining 102 an average number of bits per segment, $B_{AVG}$, based on the vector bit budget and $Np\_{init}$. Note that the vector x need not actually be split on this stage, even though an initial number of segments and an average number of bits available for an initial vector segment have been determined. The method further comprises determining 103 a final number, Np, of segments to be used in the gain shape vector encoding, based on energies of the $Np\_{init}$ segments and a difference between $B_{MAX}$ and $B_{AVG}$. By determining a final number of segments based on these parameters, an efficient allocation of the bits of the bit budget over the target vector is enabled, which will be described more in detail further below. The determining of a number of segments could alternatively be expressed as determining a number of splits, since the number of segments and the number of splits are closely related. Alternatively, the term split could be used to denote a segment.

The determined final number, Np, of segments may then be indicated to a media decoder, in order to enable the media decoder to adequately decode the encoded gain shape vector. It should be noted that it is not necessarily the actual number of segments that is indicated, but rather a change as compared to the determined initial number of segments. Regarding the determining of $Np\_{init}$, this initial number of segments may be given for the encoder and decoder. In such cases the term "determining" would refer e.g. to establishing $Np\_{init}$ for use, or similar.

Figure 2:
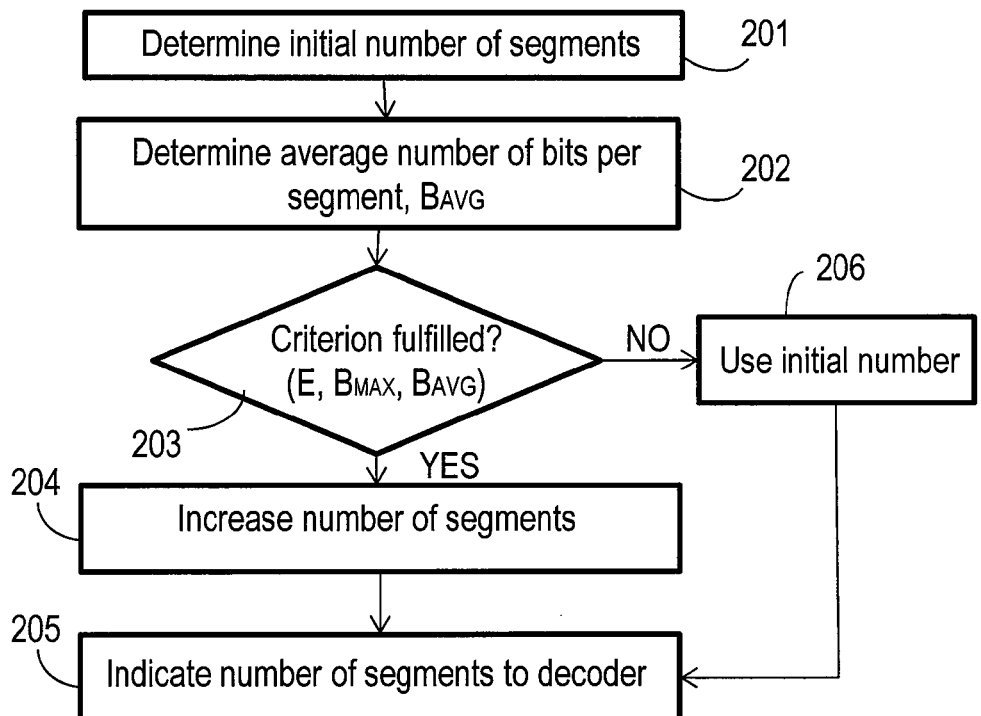

In one embodiment, illustrated in FIG. 2, the determining of a final number of segments comprises increasing 204 the number of segments (and splits) when a relation between the energies of the $Np\_{init}$ segments and the difference between $B_{MAX}$ and $B_{AVG}$ fulfills a criterion. By "increasing" the number of segments is here meant increasing, as compared to the initial number $Np\_{init}$, of segments. For example, the increase could be by one split (and segment), resulting in a final number of segments of $Np=Np\_{init}+1$. The increase of the number of segments could then be indicated 205 to a media decoder in a suitable manner. It is advantageous to use as few bits as possible for indicating the final number of segments to a decoder. When the increase is a predetermined number of segments (or splits), e.g. one, the final increased number of segments (or splits), could be indicated to the media decoder using a single bit, which is often referred to as a flag. For example, the bit could be set to "1", or "true", when an increased number of segments is applied, and be set to "0", or "false", when the initial number of segments is to be used. That is, the determining of a final number of segments may further comprise to determine 206 that the initial number, $Np\_{init}$, of segments, should be used, i.e. $Np=Np\_{init}$ when the relation between the energies of the $Np\_{init}$ segments and the difference between $B_{MAX}$ and $B_{AVG}$ does not fulfill the criterion, or, when a corresponding criterion is not met. This is illustrated as the action 206 in FIG. 2.

The determining of a final number, Np, of segments may comprise increasing 204 the number of segments, as compared to the initial number, for the target vector x, when a maximum deviation, of a target vector segment energy, from an average per-segment energy value, $E_{AVG}$, for the target vector x is larger than a threshold based on the difference between $B_{MAX}$ and $B_{AVG}$. That is, an energy variation over the target vector segments may be compared to a threshold based on the difference between $B_{MAX}$ and $B_{AVG}$. The logic behind using a maximum deviation from an average per-segment energy value, $E_{AVG}$ is, described in a simplified manner, that when there are large deviations from an average per-segment energy, there are large differences in the perceptual importance of the different segments. It should be noted that the "threshold" comparison could be expressed the other way around, such that the difference between $B_{MAX}$ and $B_{AVG}$ is compared to a threshold, which depends on, or is based on the energies of the $Np\_{init}$ segments. That is, the above could be expressed as that when the difference between $B_{MAX}$ and $B_{AVG}$ is smaller than a threshold depending on a maximum deviation, of a target vector segment energy, from an average per-segment energy value, $E_{AVG}$, for the target vector x, the number of segments should be increased, etc. For example, this could be expressed as that the number of splits should be increased when $M>\alpha(B_{MAX}-B_{AVG})$, or, when $$(B_{MAX} - B_{AVG}) < \frac{M}{\alpha};$$

where either $\alpha(B_{MAX}-B_{AVG})$ or $$\frac{M}{\alpha}$$

may be denoted threshold.

Regarding the energies of the segments, the log-energy per-segment may be calculated as:

$$E_i = \log_2\left(\sum_k x_k^2\right)$$

where i is a segment index and k is a sample index

The average per-segment energy may then be defined as:

$$E_{AVG} = \text{mean}(\{E_i\}_{i=1}^{Np})$$

A measure of energy variations may then be defined as the absolute maximum log energy deviation from the mean as:

$$M = \max(\{\text{abs}(E_i - E_{AVG})\}_{i=1}^{Np})$$

Figure 3A:
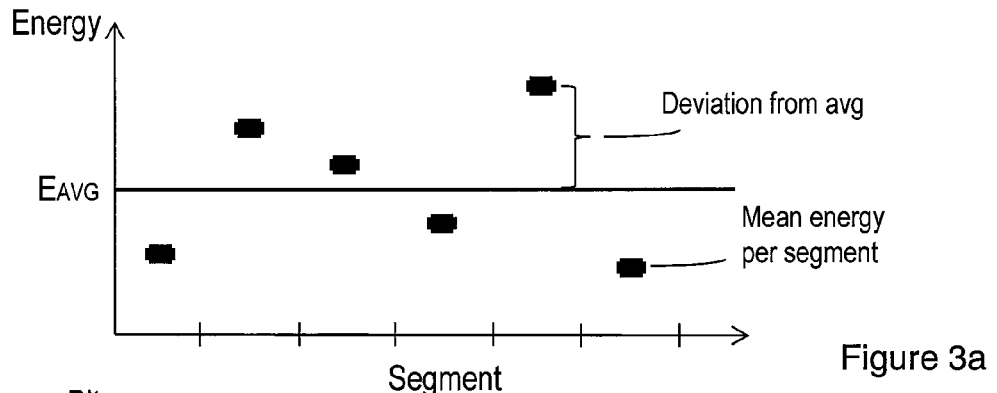
FIG. 3a illustrates $E_{AVG}$ and mean energy per segment for a number of vector segments.
Figure 3B:
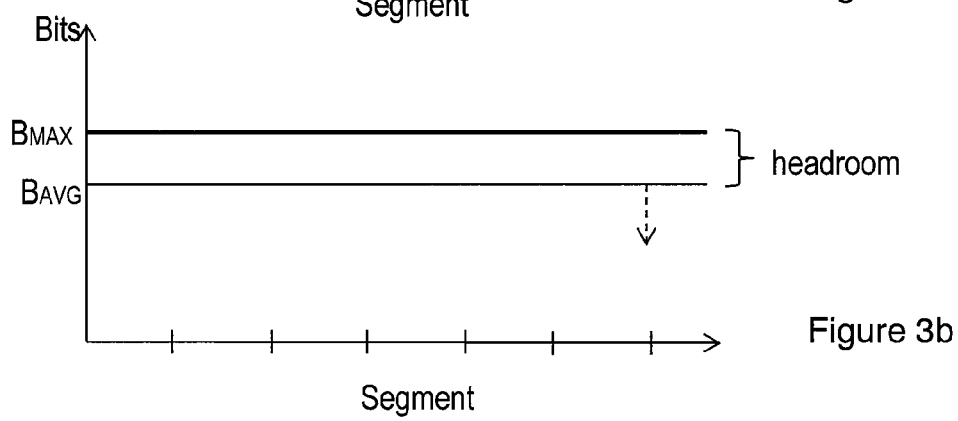
FIG. 3b illustrates $B_{MAX}$ and $B_{AVG}$ for a number of vector segments.

The determining, or decision, of when to add an additional split may be based on testing whether the energy variation measure M is above a certain threshold based on $B_{MAX}$ and $B_{AVG}$ as:

when $M > \alpha(B_{MAX} - B_{AVG})$ set $N_p = (N_{p\_init} + 1)$;
else set $N_p = N_{p\_init}$ FIG. 3a illustrates a mean energy per segment (black dots) and total average energy $E_{AVG}$ (average of the segment averages). To minimize the coding distortion, it is desired to use more bits for encoding segments comprising more energy than for encoding segments comprising less energy. Thus, when there is large variation in energy between segments, it would be desired to reallocate bits from segments comprising less energy to segments comprising more energy, assuming that all segments initially are allocated at least approximately $B_{AVG}$ bits, i.e. assuming an initial even distribution of the bits over the segments. FIG. 3b is a simple graph illustrating a number of segments, a $B_{MAX}$ value and a $B_{AVG}$ value. When the difference between $B_{MAX}$ and $B_{AVG}$, which could also be denoted the headroom herein, is "small", e.g. smaller than a threshold, it will not be possible to reallocate that many bits to the high energy content segments, before reaching $B_{MAX}$. However, by increasing the number of segments, $B_{AVG}$ will be reduced, which is illustrated by a dashed arrow in FIG. 3a, and thus increase the possibility to allocate more bits to high energy content segments. By increasing the number of segments, a higher positive deviation, in number of bits, is allowed from $B_{AVG}$, which enables reallocation of bits. The maximum allowed positive deviation is $B_{MAX} - B_{AVG}$. The term reallocation here does not imply that an average number $B_{AVG}$ of bits is actually allocated to each segment before reallocating, but is only used to facilitate understanding of the solution provided herein.

Figure 4:
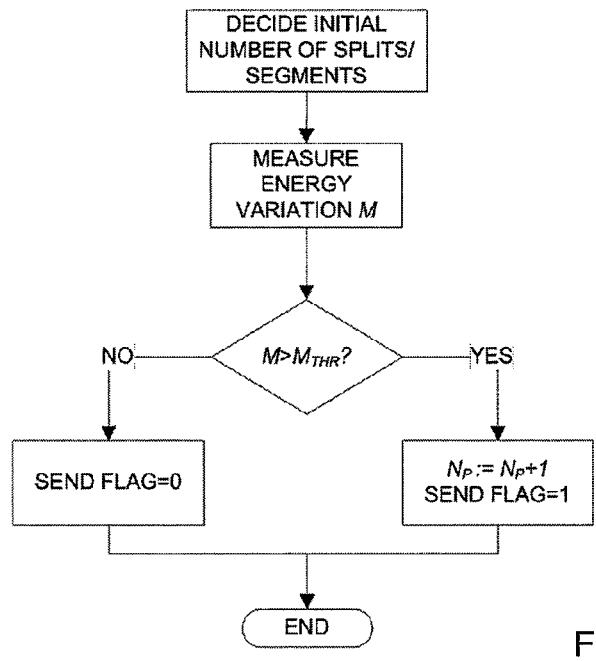
FIG. 4 is a flow chart, showing a method performed by an encoder according to an exemplifying embodiment.

An exemplifying embodiment could be described as: when an energy variation between the vector segments is "large" in relation to a headroom, $B_{MAX} - B_{AVG}$, the number of splits and segments is increased by "1", which is then indicated to a decoder by the setting of a one-bit flag. The determining of "large" may be performed by use of a threshold value, which may be selected based on e.g. simulations. This embodiment is illustrated in FIG. 4. In FIG. 4, the energy variation is denoted M, and in this example, the threshold $M_{THR}$ is based on $B_{MAX} - B_{AVG}$. Different examples of expressions for an energy variation will be described further below.

Since the difference between $B_{MAX}$ and $B_{AVG}$, i.e. the headroom, is a number of bits, which should be compared to an energy variation, e.g. a maximum deviation from an average, which is an energy measure, a tuning parameter a may be used to make the decision threshold proportional to the headroom. A value of a may be derived e.g. based on simulations.

Further, there are situations where it is not considered meaningful to perform the analysis of the number of segments described above. By analysis is here meant the determining 102 of $B_{AVG}$ and the determining 103 of a final number of segments. In such situations, it is not desired to perform the analysis or to waste bits on indicating a number of segments to the decoder. Therefore, the performing of the analysis, and the indicating of a result, may be conditioned, i.e. only be performed when at least one additional condition is met. One such additional condition may be that the vector bit budget is above a threshold. The reason for such a condition would be that when the bit budget is low, there are not that many bits to reallocate to other segments. Another additional condition could be that the initial number of splits or sections should be below a threshold. The reason for such a condition would be e.g. complexity constraints.

It should be noted that the embodiments described above are intended to be non-recursive, which implies a low complexity. This may be advantageous, as compared to more resource-demanding recursive methods. It should further be note that the segments are intended to be at least approximately evenly distributed over the vector, i.e. be of, at least approximately, equal size. This may also be an advantage, as compared to methods generating segments of very different sizes.

Figure 5:
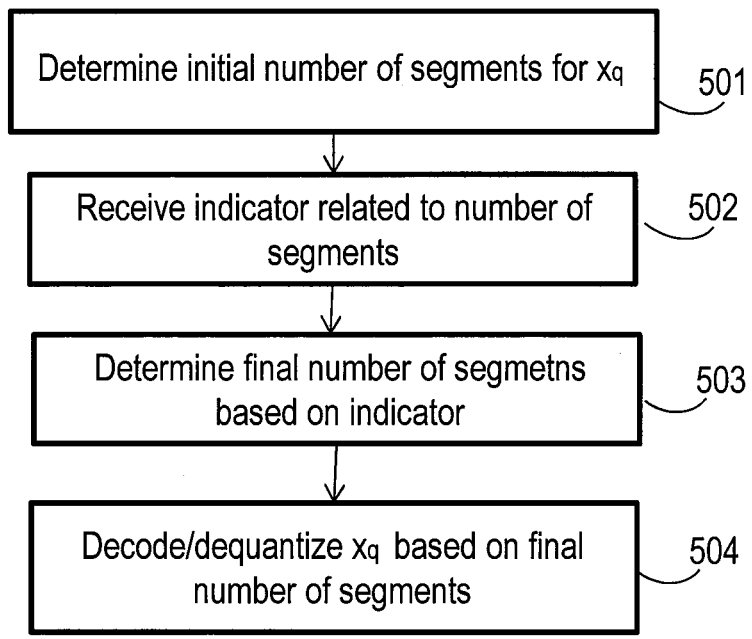
FIGS. 5-6 are flow charts showing methods performed by a decoder according to exemplifying embodiments.
Figure 6:
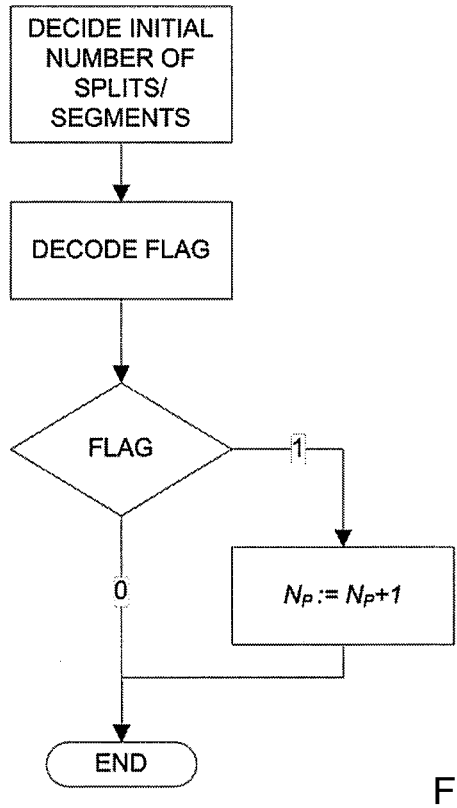

Embodiments herein further relate to a method for supporting split gain shape vector decoding. The method corresponds to the encoding method described above. The method is intended to be performed by a media decoder in situations where a representation of each vector segment of a gain shape vector x is subjected to a constraint related to a maximum number of bits, $B_{MAX}$, allowed for encoding a vector segment. The term "media" is here intended to refer to e.g. audio and/or video. A method according to an exemplifying embodiment will be described below with reference to FIG. 5. The method illustrated in FIG. 5 comprises determining 501 an initial number, $Np\_init$, of segments, for a vector to be reconstructed $x_q$; The method further comprises receiving 502 an indication, from a media encoder, of whether an increased number of segments is applied for the vector $x_q$, or not, and determining 503 a final number of segments for the decoding of the vector $x_q$ based on the initial number of segments and the received indication. The vector $x_q$ may then be decoded 504 based on the final number of segments. The indication may, in analogy with the example on the encoder side, be received in form of a bit-flag, which is set to e.g. "1" when an additional split is to be applied, $Np = Np\_init + 1$, and to "0" when the initial number of segments is to be used, $Np = Np\_init$. The use of a flag as indicator is also illustrated in FIG. 6.

In correspondence with the encoder side, the receiving of an indication may be conditioned, and thus only performed when one or more additional conditions are met. The same conditions should be used on the encoder and decoder side. Such additional conditions may, as previously stated, be e.g. that the vector bit budget is above a threshold T1, and that the initial number of splits or segments is below a threshold T2, and/or that the bitrate per sample $B_{SAMPLE}$ is above a given limit. (T1 and T2 are just used to indicate that it is not the same threshold for the two cases).

Below some more details and variants of the solution provided herein will be described. Embodiments of a media encoder and media decoder corresponding to the methods embodiments described above will be described at the end of the detailed description.

Energy variations across a target vector can be captured by splitting the target vector into smaller sections. The benefit of the split will depend on the energy distribution of the target vector. This can be illustrated by calculating the variance $\sigma^2$ of the target signal after normalizing the energies in each section. Assuming that the sections have equal size, this can be expressed as $$\sigma^2 = \frac{1}{N_p} \sum_{i=1}^{N_p} \sigma_i^2$$

where the $\sigma_i^2$ is the variance of section i, and $N_p$ is the number of segments.

Figure 7:
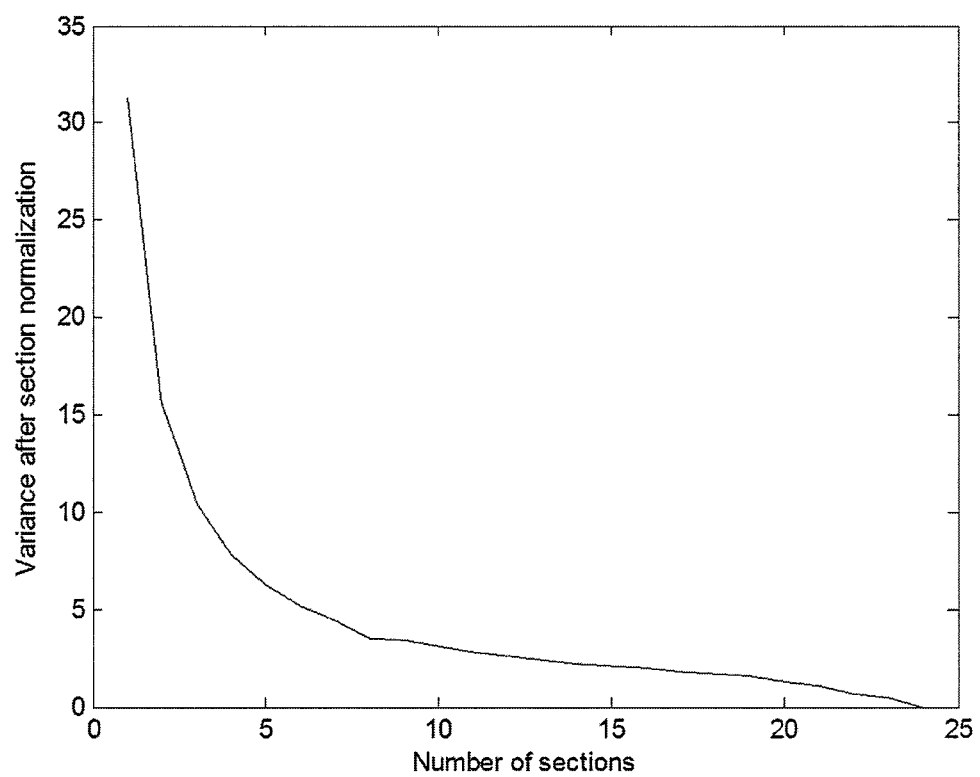
FIG. 7 is a diagram showing a general decrease of shape variance with number of splits.
Figure 8:
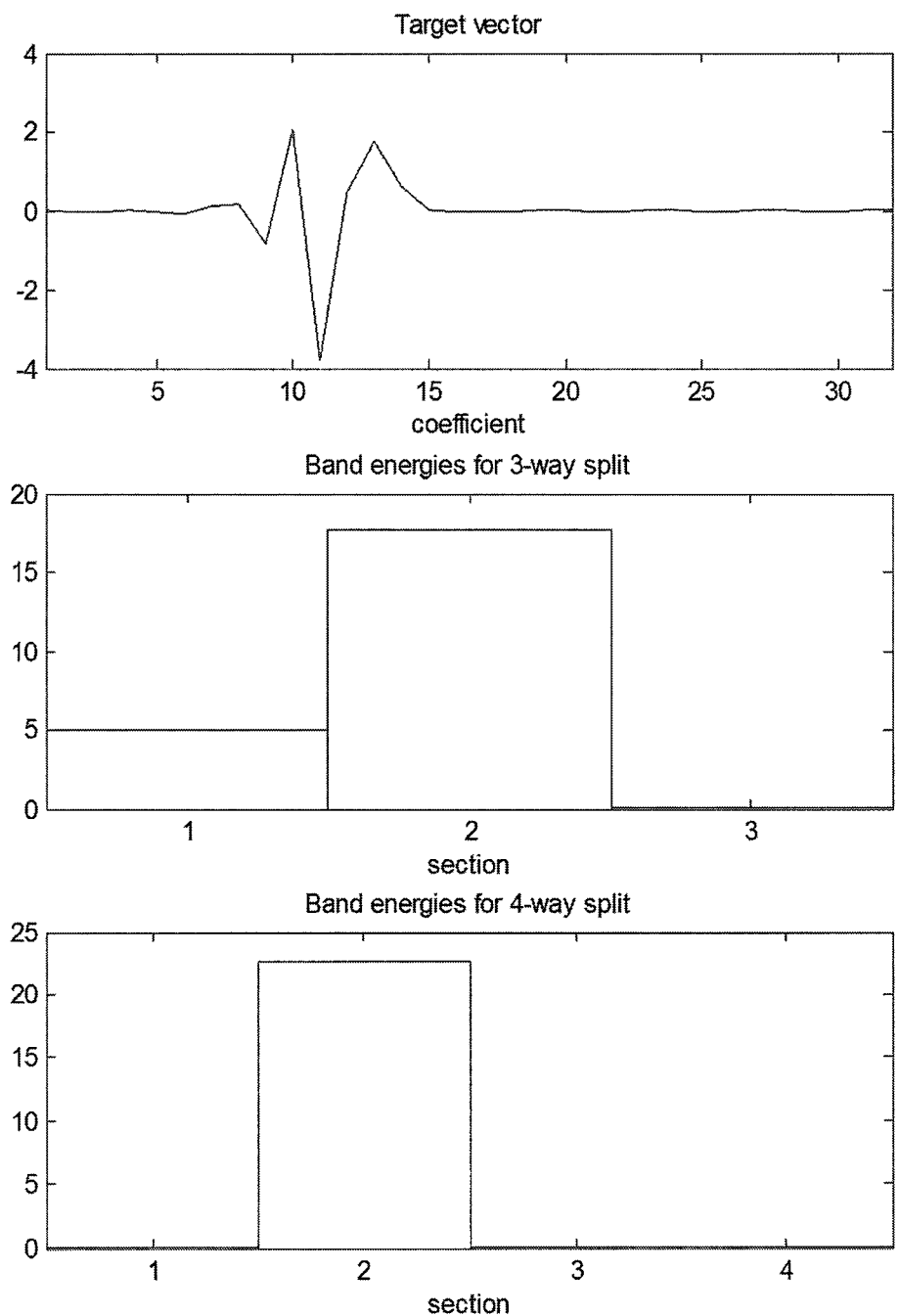
FIG. 8 shows an example of a target vector (upper figure) and the corresponding energies for 3 splits (middle figure) and 4 splits (lower figure). Note that the model with 4 splits more closely follows the energy dynamics in the target vector.
Figure 9:
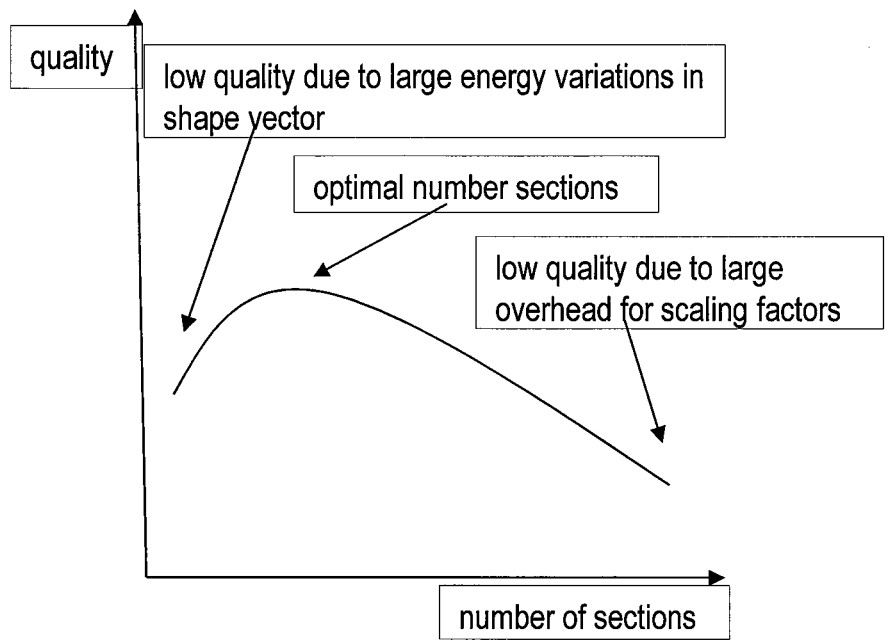
FIG. 9 is a diagram showing a trade-off in splitting target vector for gain-shape quantization. Low number of splits cannot normalize shape vector sufficiently well. High number of splits requires large bit overhead for transmitting the gains, and as a consequence, not sufficient number of bits are left for the shape coding.

Typically the variance value decreases fast for the first few number of splits but then saturates, as illustrated in FIG. 7. Looking at the shape of the graph in FIG. 7, the saturation point can be interpreted as the point where further resolution in more sections is not needed. Further, it may be noted that this curve will always converge to zero since the final split will result in sections containing one sample each with variance zero. An example target vector with corresponding section energies for 3 and 4-way split is shown in FIG. 8.

In another embodiment, the variance of the energies among the sections/segments is compared for different split configurations, i.e. for different numbers of segments. A large increase in variance between different split configurations, e.g. 3 segments vs. 2 segments, indicates that it would be beneficial with additional splitting of the target vector. The variance V is computed as $$V = \frac{1}{N_p} \sum_i \left( E_i^{coeff} - \overline{E}^{coeff} \right)$$

with the energy per coefficient in a segment i:

$$E_i^{coeff} = \frac{1}{BW_i} \sum_k x_k^2$$

where $BW_i$ is the length of the segment, and, with the average energy per coefficient:

$$\overline{E}^{coeff} = \text{mean}(\{E_i^{coeff}\}_{i=1}^{N_p})$$

Figure 11:
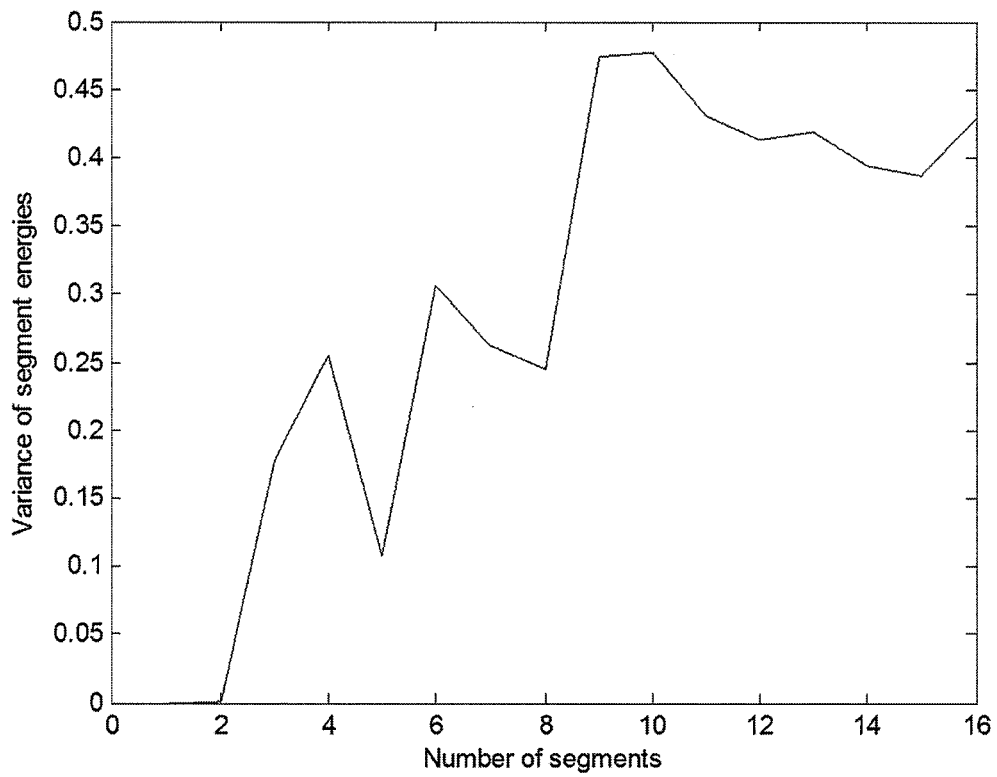
FIG. 11 is a diagram showing variance of segment energies as a function of number of segments the target vector in FIG. 10 is split into.
Figure 10:
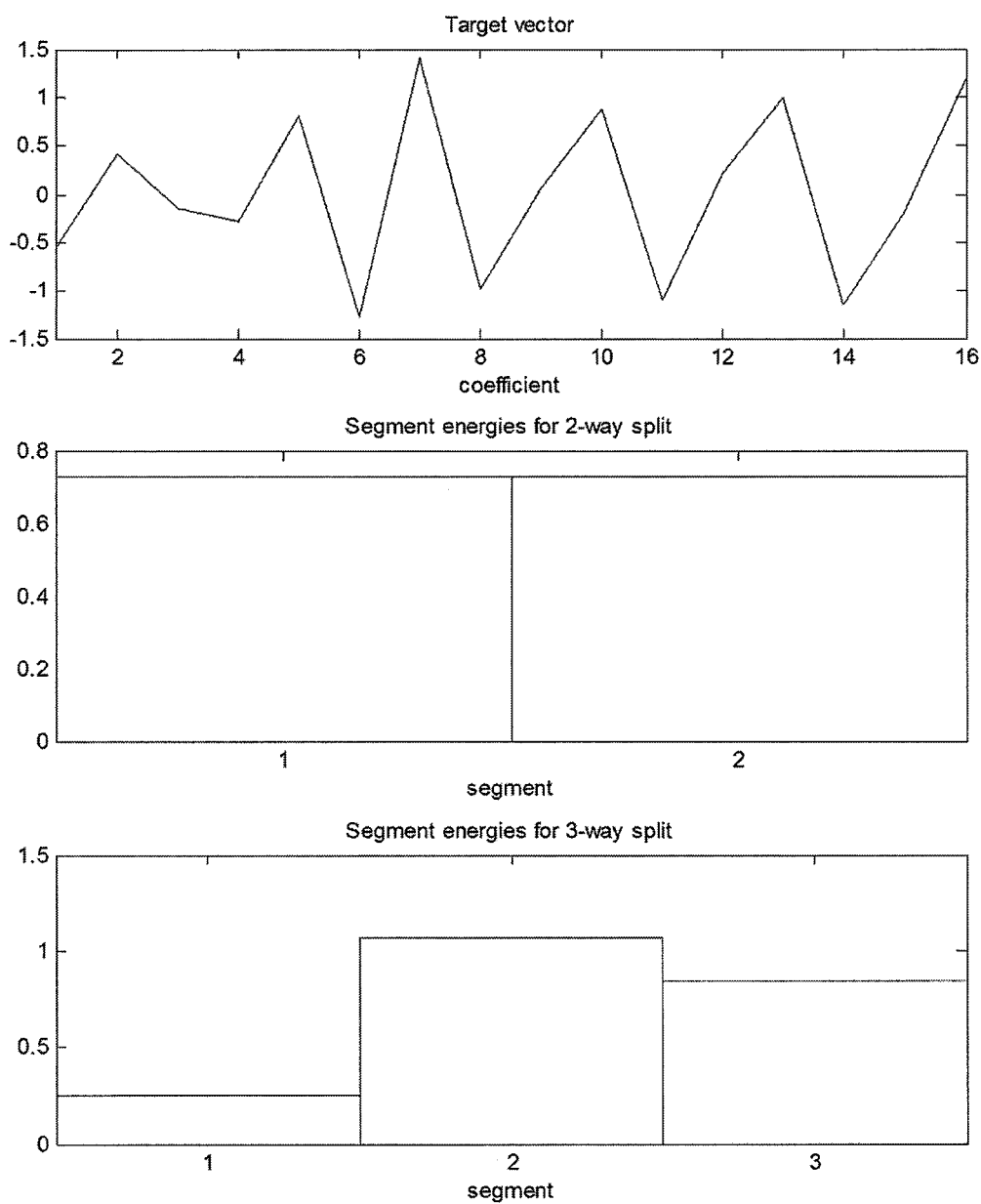
FIG. 10 shows an example of a target vector and the corresponding segment energies for 2 and 3-way split.

FIG. 10 illustrates an example target vector (upper figure) and the corresponding segment energies for 2 (middle figure) and 3-way (lower figure) split, respectively, of the example target vector. In FIG. 11, the corresponding variance of the segment energies is shown for a varying number of segments. Considering the change from 2 segments to 3 segments, the variance V is increasing, which then indicates that a split into 3 segments would be beneficial over a split into 2 segments. In an embodiment the decision for additional split is made on basis of:

if $V_{N_p+1} - V_{N_p} > \beta$
  $N_p = N_p + 1$
  send flag=1
else
  send flag=0 where $\beta$ is a lower threshold for the increase in variance of the segment energies between two consecutive number of splits. When the increase in variance is sufficient, i.e. in this example exceeds the threshold the number of segments is increased, e.g. by one. As previously mentioned, the use of an additional split could be signalled from the encoder to the decoder by, for example, using one bit for signalling one additional split or no additional split. However, more bits could be used for signalling more than one additional split if preferred.

A variation on the embodiment above is to directly use the average energy per coefficient $\overline{E}^{coeff}$ in normalized segments as a measure of the energy variations. The motivation for doing this is that when the average energy per coefficient does not change much between two consecutive number of splits, the distribution within each segment is similar and does not benefit from further splitting, while a large change between two consecutive number of splits motivates an additional split. The decision can be made based on a threshold $\gamma$ similar to the above expression:

if $\overline{E}_{N_p+1}^{coeff} - \overline{E}_{N_p}^{coeff} > \gamma$
  $N_p = N_p + 1$
  send flag=1
else
  send flag=0

In another embodiment, assuming that and initial number of segments $Np\_{init}$ is given, e.g., due to quantizer constraints, the algorithm makes a decision to increase $Np\_{init}$ or not with the following procedure:

First, the log-energy per-segment is calculated as:

$$E_i = \log_2\left(\sum_k x_k^2\right)$$

The average per-segment energy is then defined as:

$$E_{AVG} = \text{mean}(\{E_i\}_{i=1}^{N_p})$$

A measure of energy variations is defined as the absolute maximum log energy deviation from the mean:

$$M = \max(\{\text{abs}(E_i - E_{AVG})\}_{i=1}^{N_p})$$

The absolute is used in case it is essential to trigger on any large deviation from mean value, be it positive or negative. In some cases, only the upper limit is of importance, in which case the absolute value may be omitted, as:

$$M_{alt} = \max(\{(E_i - E_{AVG})\}_{i=1}^{N_p})$$

In yet another embodiment, the lower limit may be of larger importance, and the measure may then be defined to find the smallest negative deviation:

$$M_{alt2} = \text{abs}(\min(\{(E_i - E_{AVG})\}_{i=1}^{N_p}))$$

In all exemplary embodiments of the energy deviation measure, the intent is to increase the number of splits in case the estimated energy deviation is large. The reason is that an additional split should provide slightly more freedom to allocate the bits locally, as previously described. The decision when to add an additional split may be based on testing whether the energy variation measure M is above a certain threshold $M_{THR}$ as (which is also illustrated in FIG. 4):

if $M > M_{THR}$
   $N_p = N_p + 1$
   send flag=1
else
   send flag=0

In one embodiment, the decision for additional split may also be affected by the constraints on the encoder for the different sections or segments. In such cases, an additional split may be needed if the necessary bit allocation cannot be fit below the maximum number of bits for each section or segment, $B_{MAX}$. As previously mentioned, the difference between the maximum number of bits per section $B_{MAX}$ and the average number of bits per section $B_{AVG}$ may be denoted the headroom for the bit allocation ($B_{MAX} - B_{AVG}$). The average bits per band may be calculated as $$B_{AVG} = \frac{B_{BAND}}{N_P}$$

where $B_{BAND}$ denotes the number of bits for the given band, i.e. the bit budget for a target vector representing the band. The term "band" could here be interpreted e.g. as the frequency band, which the target vector represents. Further, the decision threshold may be adjusted using a tuning parameter a to make the decision threshold proportional to the headroom:

if $M > \alpha(B_{MAX} - B_{AVG})$
   $N_p = N_p + 1$
   send flag=1
else
   send flag=0

The decision to use an additional split may also be encoded as a parameter and sent from the encoder to the decoder. To ensure that the additional split signalling is only done when it is needed, e.g. since it requires an extra bit when used, the above algorithm may be restricted to be used only is situations where it may be beneficial. For instance, it may be limited to be used only when the initial number of splits or segments $Np_{\_init}$ is below a maximum number of splits or segments, e.g. $N_{p\_init} < N_{p,max}$ and/or when the bitrate per sample $B_{SAMPLE}$ is above a given limit, e.g. $B_{SAMPLE} > B_{SAMPLE,THR}$. To be synchronized, the same condition should be used in the encoder and decoder for correct bitstream decoding.

It is an advantage of the embodiments that they may improve the performance of gain-shape quantization schemes. The criterion for split requires insignificant additional computational complexity, and since quantizing smaller segments is less complex than quantizing the entire target vector, the proposed algorithm of the embodiments may also achieve a reduction in computational complexity.

Implementations

The methods and techniques described above may be implemented in encoders and decoders, which may be part of other devices.

Figure 12A:
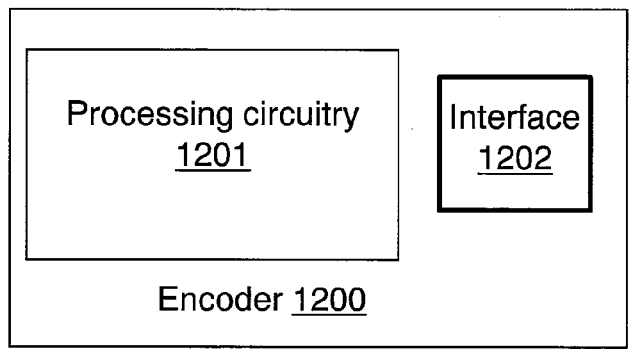
FIGS. 12a-14 illustrate different implementations of an encoder and/or decoder according to exemplifying embodiments.
Figure 12B:
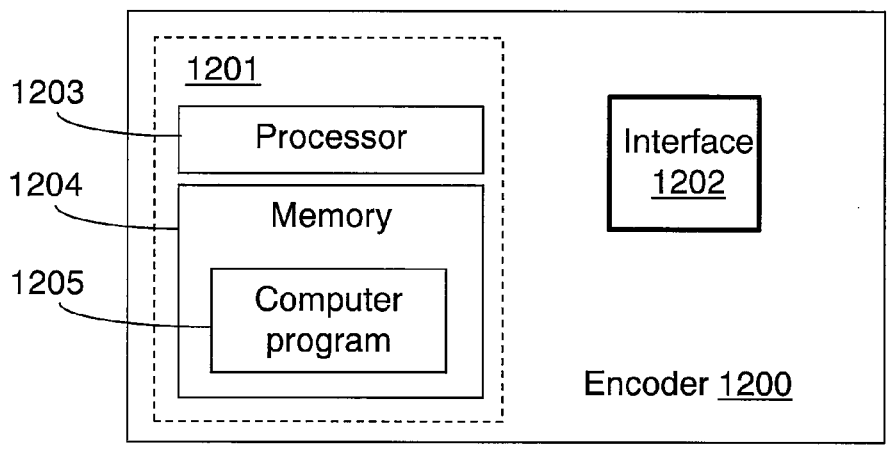
Figure 12C:
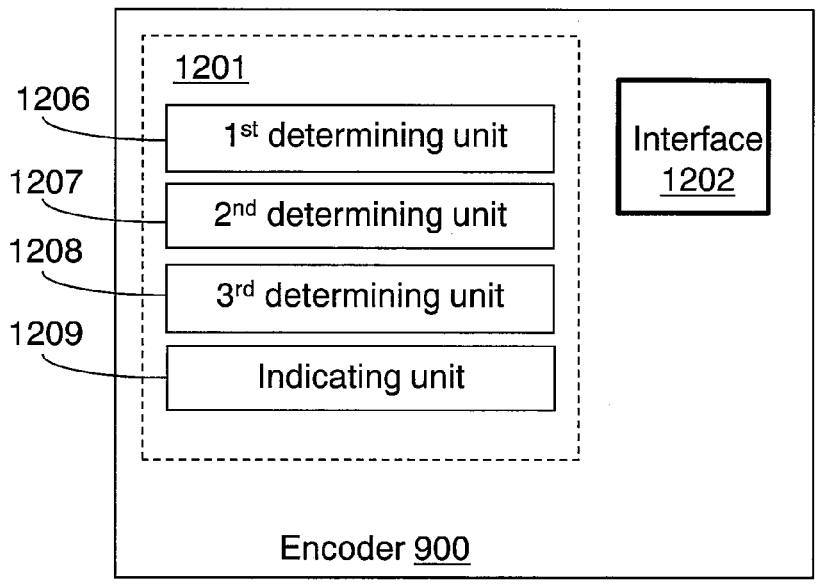

Encoder, FIGS. 12a-12c

An exemplifying embodiment of a media encoder is illustrated in a general manner in FIG. 12a. By media encoder is referred to an encoder for e.g. audio and/or video signals. The encoder 1200 is configured to perform at least one of the method embodiments described above with reference to any of FIGS. 1-2 and 4. The encoder 1200 is associated with the same technical features, objects and advantages as the previously described method embodiments. The encoder will be described in brief in order to avoid unnecessary repetition.

The encoder may be implemented and/or described as follows:

The encoder 1200 is configured for split gain shape vector encoding. The encoder 1200 comprises processing circuitry, or processing means 1201 and a communication interface 1202. The processing circuitry 1201 is configured to cause the encoder 1200 to, for a target shape vector x: determine an initial number $Np_{\_init}$ of segments, and further to determine an average number of bits per segment, $B_{AVG}$, based on a vector bit budget and $Np_{\_init}$. The processing circuitry 1201 is further configured to cause the encoder to determine a final number of segments to be used in the gain shape vector encoding based on energies of the $Np_{\_init}$ segments and a difference between $B_{MAX}$ and $B_{AVG}$. The communication interface 1202, which may also be denoted e.g. Input/Output (I/O) interface, includes an interface for sending data to and receiving data from other entities or modules.

The processing circuitry 1201 could, as illustrated in FIG. 12b, comprise processing means, such as a processor 1203, e.g. a CPU, and a memory 1204 for storing or holding instructions. The memory would then comprise instructions, e.g. in form of a computer program 1205, which when executed by the processing means 1203 causes the encoder 1200 to perform the actions described above.

An alternative implementation of the processing circuitry 1201 is shown in FIG. 12c. The processing circuitry here comprises a first determining unit 1206, configured to cause the encoder 1200 to: determine an initial number $Np_{\_init}$ of segments for a target shape vector x. The processing circuitry further comprises a second determining unit 1207 configured to cause the encoder to determine an average number of bits per segment, $B_{AVG}$, based on a vector bit budget and $Np_{\_init}$. The processing circuitry further comprises a third determining unit 1208, configured to cause the encoder to determine a final number of segments, for the vector x, to be used in the gain shape vector encoding, based on energies of the $Np_{\_init}$ segments and a difference between $B_{MAX}$ and $B_{AVG}$. The processing circuitry 1201 could comprise more units, such as an indicating unit 1209 configured to cause the encoder to indicate the final number of segments, e.g. an increase by one segment as compared to the initial number, to a media decoder. This task could alternatively be performed by one of the other units.

The encoders described above could be configured for the different method embodiments described herein, such as increasing the number of segments, as compared to the initial number, for the target vector x for the gain shape vector encoding when a maximum deviation, of a target vector segment energy, from an average per-segment energy value, $E_{AVG}$, for the target vector x is larger than a threshold based on the difference between $B_{MAX}$ and $B_{AVG}$.

The encoder 1200 may be assumed to comprise further functionality, for carrying out regular encoder functions.

Figure 13A:
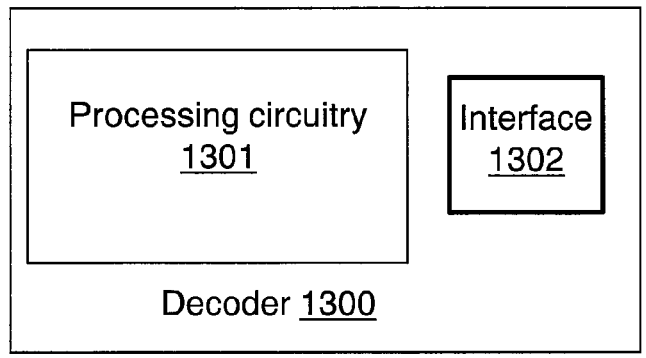
Figure 13B:
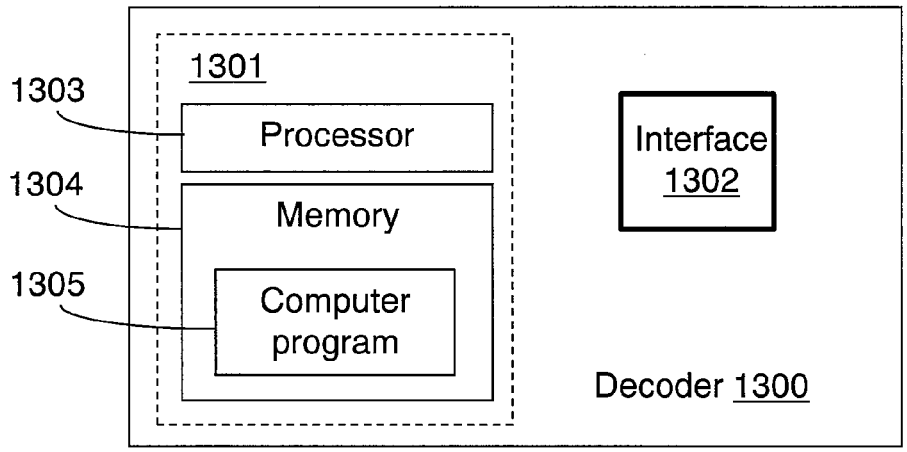
Figure 13C:
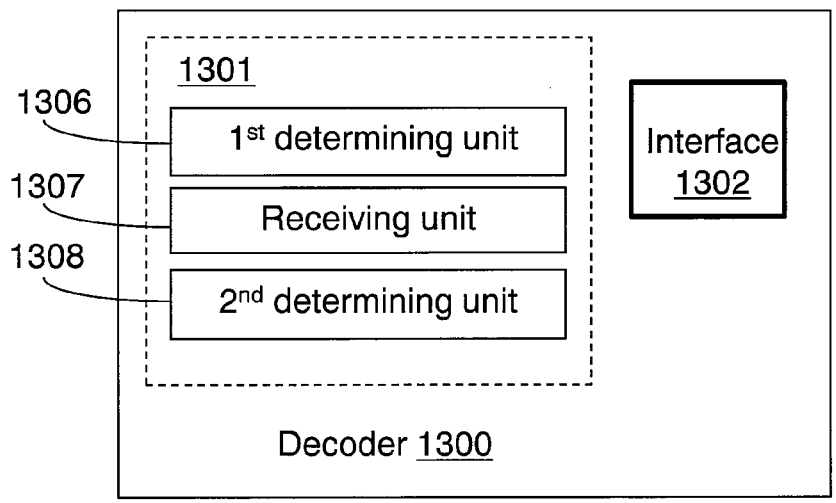

Decoder, FIGS. 13a-13c

Embodiments herein also relate to a media decoder 1300 configured for carrying out embodiments of the decoding method described above. That is, the method for supporting split gain shape vector decoding, illustrated e.g. in FIG. 5. An exemplifying embodiment of a decoder 1300 is illustrated in a general manner in FIG. 13a. The decoder 1300 is configured to perform at least one of the method embodiments described above with reference to FIGS. 5-6. The decoder 1300 is associated with the same technical features, objects and advantages as the previously described method embodiments. The decoder will be described in brief in order to avoid unnecessary repetition.

The decoder 1300 is configured for supporting split gain shape vector decoding, and is operable to perform split gain shape vector decoding. The decoder 1300 comprises processing circuitry 1301 and a communication interface 1302. The processing circuitry 1301 is configured to cause the network node to determine an initial number $Np\_{init}$, for a vector $x_q$ to be reconstructed; and further to receive an indication, from a media encoder, of whether an increased number of segments is applied for the vector $x_q$, or not. The processing circuitry 1301 is further configured to cause the network node to determine a final number of segments for the decoding of the vector $x_q$ based on the received indication. The communication interface 1302, which may also be denoted e.g. Input/Output (I/O) interface, includes an interface for sending data to and receiving data from other entities or modules.

The processing circuitry 1301 could, as illustrated in FIG. 13b, comprise processing means, such as a processor 1303, and a memory 1304 for storing or holding instructions. The memory would then comprise instructions, e.g. in form of computer program 1305, which when executed by the processing means 1303 causes the network node 1300 to perform the actions described above.

An alternative implementation of the processing circuitry 1301 is shown in FIG. 13c. The processing circuitry here comprises a first determining unit 1306, configured to cause the network node to determine an initial number of segments, $Np\_{init}$, for a vector $x_q$ to be reconstructed. The processing circuitry 1301 further comprises a receiving unit 1307, configured to cause the network node to receive an indication, from a media encoder, of whether an increased number of segments is applied for the vector $x_q$, or not. The processing circuitry 1301 further comprises a second determining unit 1308, configured to cause the network node to determine a final number of segments for the decoding of the vector $x_q$ based on the received indication.

The network node 1300 may be assumed to comprise further functionality, for carrying out regular decoder functions.

Figure 14:
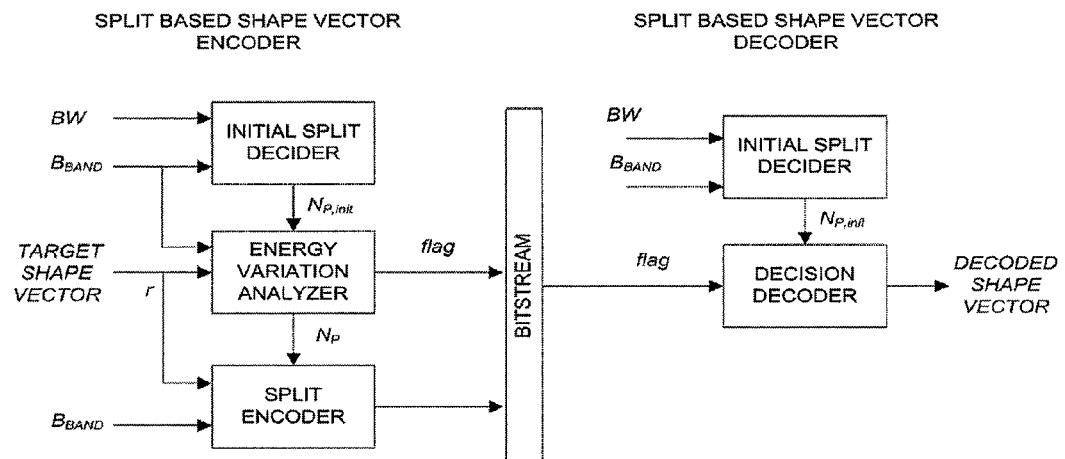

The encoder and decoder could alternatively be described and/or implemented as illustrated in FIG. 14. FIG. 14 is a schematic block diagram of a split algorithm encoder and decoder according to embodiments of the herein suggested solution. The encoder comprises an initial split decider unit, an energy variation analyzer unit, and a split encoder unit. The decoder comprises an initial split decider, and a decision decoder. The encoder and the decoder with its included units could be implemented in hardware and/or software.

Figure 15:
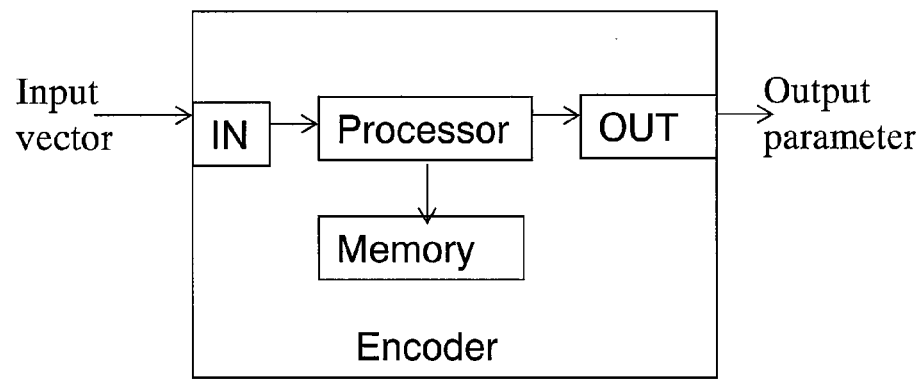
FIG. 15 illustrates an encoder according to exemplifying embodiments.
Figure 16:
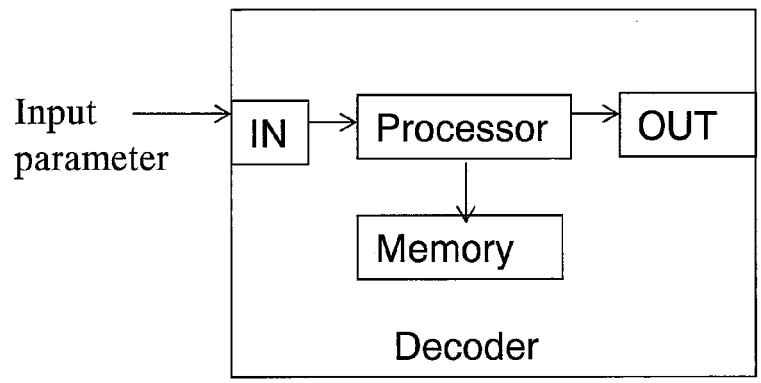
FIG. 16 illustrates a decoder according to exemplifying embodiments.

The encoder and decoder described herein could alternatively be implemented e.g. by one or more of a processor and adequate software with suitable storage or memory therefore, in order to perform the determining of an adequate number of splits and/or segments of an input vector, according to the embodiments described herein, see FIGS. 15 and 16. For the encoder illustrated in FIG. 15, the incoming vector is received by an input (IN), to which the processor and the memory are connected, and the encoded representation of the vector, e.g. an audio signal (parameters), obtained from the software is outputted from the output (OUT).

The decoder described herein could be implemented e.g. by one or more of a processor and adequate software with suitable storage or memory therefore, in order to perform the decoding of the input parameters, according to the embodiments described herein, see FIG. 16. The incoming parameters are received by an input (IN), to which the processor and the memory are connected, and the decoded signal obtained from the software is outputted from the output (OUT).

The technology described above may be comprised e.g. in a wireless device such as e.g. a user equipment, a mobile terminal, a tablet, a mobile wireless device for machine-to-machine communication, an integrated or embedded wireless card, an externally plugged in wireless card, a dongle, etc, or in a stationary or semi stationary device, such as a personal computer or a smart TV.

Concluding Remarks

The steps, functions, procedures, modules, units and/or blocks described herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules, units and/or blocks described above may be implemented in software such as a computer program for execution by suitable processing circuitry including one or more processing units. The software could be carried by a carrier, such as an electronic signal, an optical signal, a radio signal, or a computer readable storage medium before and/or during the use of the computer program in the network nodes.

The flow diagram or diagrams presented herein may be regarded as a computer flow diagram or diagrams, when performed by one or more processors. A corresponding apparatus may be defined as a group of function modules, where each step performed by the processor corresponds to a function module. In this case, the function modules are implemented as a computer program running on the processor.

Examples of processing circuitry includes, but is not limited to, one or more microprocessors, one or more Digital Signal Processors, DSPs, one or more Central Processing Units, CPUs, and/or any suitable programmable logic circuitry such as one or more Field Programmable Gate Arrays, FPGAs, or one or more Programmable Logic Controllers, PLCs. That is, the units or modules in the arrangements in the different nodes described above could be implemented by a combination of analog and digital circuits, and/or one or more processors configured with software and/or firmware, e.g. stored in a memory. One or more of these processors, as well as the other digital hardware, may be included in a single application-specific integrated circuitry, ASIC, or several processors and various digital hardware may be distributed among several separate components, whether individually packaged or assembled into a system-on-a-chip, SoC.

It should also be understood that it may be possible to re-use the general processing capabilities of any conventional device or unit in which the proposed technology is implemented. It may also be possible to re-use existing software, e.g. by reprogramming of the existing software or by adding new software components.

The embodiments described above are merely given as examples, and it should be understood that the proposed technology is not limited thereto. It will be understood by those skilled in the art that various modifications, combinations and changes may be made to the embodiments without departing from the present scope. In particular, different part solutions in the different embodiments can be combined in other configurations, where technically possible.

When using the word "comprise" or "comprising" it shall be interpreted as non-limiting, i.e. meaning "consist at least of".

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the technology disclosed herein, for it to be encompassed hereby.

In some instances herein, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, e.g. any elements developed that perform the same function, regardless of structure.

Below, a set of 29 additional exemplifying embodiments are listed. The embodiments mainly corresponds to the previously described embodiments, but are slightly differently formulated.

Embodiment 1: A method for supporting split gain shape vector encoding performed by a media encoder, where the encoding of each vector segment is subjected to a constraint related to a maximum number of bits, $B_{MAX}$, allowed for encoding a vector segment, the method comprising:
for a target vector x:
determining an initial number of splits, for dividing the target vector x into an initial number $Np\_{init}$ of segments;
determining an average number of bits per segment, $B_{AVG}$, based on a vector bit budget and $Np\_{init}$; and:
determining a final number of splits to be used in the gain shape vector encoding based on a difference between $B_{MAX}$ and $B_{AVG}$.

Embodiment 2: The method according to embodiment 1, wherein the determining of a final number of splits comprises:
when the difference between $B_{MAX}$ and $B_{AVG}$ is smaller than a threshold (203):
increasing the number of splits, as compared to the initial number, for the target vector x for the gain shape vector encoding.

Embodiment 3: The method according to embodiment 2, wherein the threshold depends on an energy variation over the target vector segments.

Embodiment 4: The method according to any of embodiments 2-3, wherein the threshold depends on a maximum deviation, of a target vector segment energy, from an average per-segment energy value, $E_{AVG}$, for the target vector x.

Embodiment 5: The method according to any of embodiments 2-4, further comprising:
indicating the increase of the number of splits to a media decoder.

Embodiment 6: The method according to any of embodiments 1-4, further comprising:
indicating the final number of splits to a media decoder.

Embodiment 7: The method according to any of embodiments 1-6, wherein the determining of $B_{AVG}$ and of a final number of splits based on a difference between $B_{MAX}$ and $B_{AVG}$ is only performed when at least one additional condition is met.

Embodiment 8: The method according to any of embodiments 1-7, wherein the determining of $B_{AVG}$ and of a final number of splits based on a difference between $B_{MAX}$ and $B_{AVG}$ is performed when the vector bit budget is above a threshold for additional splits and/or when a bitrate per sample is above a given limit.

Embodiment 9: The method according to any of embodiments 1-8, wherein the determining of $B_{AVG}$ and of a final number of splits based on a difference between $B_{MAX}$ and $B_{AVG}$ is performed when the initial number of splits is below a threshold.

Embodiment 10: A method for supporting split gain shape vector decoding performed by a media decoder, where a representation of each vector segment of a gain shape vector x is subjected to a constraint related to a maximum number of bits, $B_{MAX}$, allowed for encoding a vector segment, the method comprising:
determining an initial number of splits, for a vector $x_q$ to be reconstructed;
receiving an indication, from a media encoder, of whether an increased number of splits is applied for the vector $x_q$, or not, and
determining a final number of splits for the decoding of the vector $x_q$ based on the received indication.

Embodiment 11: The method according to embodiment 10, further comprising:
decoding the vector $x_q$ based on the final number of splits.

Embodiment 12: The method according to embodiment 10 or 11, wherein the receiving of the indication is only performed when one or more additional conditions are met.

Embodiment 13: The method according to embodiment 12, where an additional condition is that the vector bit budget is above a threshold for additional splits Embodiment 14: The method according to embodiment 12 or 13 where an additional condition is that the initial number of splits is below a threshold and/or that a bitrate per sample is above a given limit.

Embodiment 15: Media encoder operable to perform split gain shape vector encoding, where the encoding of each vector segment is subjected to a constraint related to a maximum number of bits, $B_{MAX}$, allowed for encoding a vector segment, the media encoder being configured to:
for a target vector x:
determine an initial number of splits, for dividing the target vector x into an initial number $Np_{\_init}$ of segments;
determine an average number of bits per segment, $B_{AVG}$, based on a vector bit budget and $Np_{\_init}$, and:
determine a final number of splits to be used in the gain shape vector encoding based on a difference between $B_{MAX}$ and $B_{AVG}$.

Embodiment 16: The media encoder according to embodiment 15, being configured to, in order to determine the final number of splits:
when a difference between $B_{MAX}$ and $B_{AVG}$ is smaller than a threshold:
increase the number of splits, as compared to the initial number, for the target vector x for the gain shape vector encoding Embodiment 17: The media encoder according to embodiment 16, wherein the threshold depends on an energy variation over the target vector segments.

Embodiment 18: The media encoder according to any of embodiments 16 or 17, wherein the threshold depends on a maximum deviation, of a target vector segment energy, from an average per-segment energy value, $E_{AVG}$, for the target vector x.

Embodiment 19: The media encoder according to any of embodiments 16-18, being further configured to:
indicate the increase of the number of splits to a media decoder.

Embodiment 20: The media encoder according to any of embodiments 15-18, being further configured to:
indicate the final number of splits to a media decoder.

Embodiment 21: The media encoder according to any of embodiments 15-20, being further configured to determine $B_{AVG}$ and a final number of splits based on a difference between $B_{MAX}$ and $B_{AVG}$ only when at least one additional condition is met.

Embodiment 22: The media encoder according to any of embodiments 15-21, being configured to determine $B_{AVG}$ and a final number of splits based on a difference between $B_{MAX}$ and $B_{AVG}$ when the vector bit budget is above a threshold for additional splits.

Embodiment 23: The media encoder according to any of embodiments 15-22, being configured to determine $B_{AVG}$ and a final number of splits based on a difference between $B_{MAX}$ and $B_{AVG}$ when the initial number of splits is below a threshold.

Embodiment 24: A media decoder operable to perform gain shape vector decoding, where a representation of each vector segment of a gain shape vector x is subjected to a constraint related to a maximum number of bits, $B_{MAX}$, allowed for encoding a vector segment; the media decoder being configured to:
determine an initial number of splits for a vector $x_q$ to be reconstructed;
receive an indication, from a media encoder, of whether an increased number of splits is applied for the vector $x_q$, or not, and to
determine a final number of splits for the decoding of the vector $x_q$ based on the received indication.

Embodiment 25: The media decoder according to embodiment 24, being further configured to:
decode the vector $x_q$ based on the final number of splits.

Embodiment 26: Wireless device comprising a media encoder according to any of embodiments 15-23.

Embodiment 27: Wireless device comprising a media decoder according to any of embodiments 24-25.

Embodiment 28: Computer program comprising instructions which, when executed on at least one processor, cause the at least one processor to carry out the method according to any one of embodiments 1-14.

Embodiment 29: A carrier containing the computer program of the previous embodiment, wherein the carrier is one of an electronic signal, optical signal, radio signal or computer readable storage medium.

ABBREVIATIONS $N_p$ number of sections
E logarithm of segment energy
$E_{AVG}$ average segment energy over segments of a target vector
$B_{MAX}$ maximum allowed bits per segment
$B_{AVG}$ average bits per segment
$B_{SAMPLE}$ bits per sample
$B_{BAND}$ allocated bits for a given band
BW band width
x target vector
r shape vector (also called residual)
G gain (scalar or vector) for scaling target vector
i segment index
k sample index

The invention claimed is:

1. A method for supporting split gain shape vector encoding performed by a media encoder, where the encoding of each vector segment is subjected to a constraint related to a maximum number of bits, $B_{MAX}$, allowed for encoding a vector segment, the method comprising:
for a target vector x:
determining an initial number, $Np_{\_init}$, of segments for the target vector x;
determining an average number of bits per segment, $B_{AVG}$, based on a vector bit budget and $Np_{\_init}$; and
determining a final number of segments to be used in the gain shape vector encoding based on energies of the $Np_{\_init}$ segments and a difference between $B_{MAX}$ and $B_{AVG}$,
thereby enabling an efficient allocation of the bits of the bit budget over the target vector.

2. The method according to claim 1, wherein the determining of a final number of segments comprises:
increasing the number of segments, as compared to the initial number, for the target vector x, when a relation between the energies of the $Np_{\_init}$ segments and the difference between $B_{MAX}$ and $B_{AVG}$ fulfills a criterion.

3. The method according to claim 2, further comprising:
indicating the increase of the number of segments to a media decoder.

4. The method according to claim 1, wherein the determining of a final number of segments comprises:
increasing the number of segments, as compared to the initial number, for the target vector x, when a maximum deviation, of a target vector segment energy, from an average per-segment energy value, $E_{AVG}$, for the target vector x is larger than a threshold based on the difference between $B_{MAX}$ and $B_{AVG}$.

5. The method according to claim 1, further comprising:
indicating the final number of segments to a media decoder.

6. The method according to claim 1, wherein the determining of $B_{AVG}$ and of a final number of segments is only performed when at least one additional condition is met.

7. The method according to claim 1, wherein the determining of $B_{AVG}$ and of a final number of segments is performed when the vector bit budget is above a threshold for additional splits and/or when a bitrate per sample is above a given limit.

8. The method according to claim 1, wherein the determining of $B_{AVG}$ and of a final number of segments is performed when the initial number of segments is below a threshold.

9. A non-transit computer readable medium having instructions stored therein which, when executed on at least one processor, causes the at least one processor to perform the method according to claim 1.

10. A method for supporting split gain shape vector decoding performed by a media decoder, where a representation of each vector segment of a gain shape vector x is subjected to a constraint related to a maximum number of bits, $B_{MAX}$, allowed for encoding a vector segment, the method comprising:
   determining an initial number of segments, for a vector $x_q$ to be reconstructed;
   receiving an indication, from a media encoder, of whether an increased number of segments is applied for the vector $x_q$, or not, and
   determining a final number of segments for the decoding of the vector $x_q$ based on the received indication.

11. The method according to claim 10, further comprising: decoding the vector $x_q$ based on the final number of segments.

12. The method according to claim 10, wherein the receiving of the indication is only performed when one or more additional conditions are met.

13. The method according to claim 12, where an additional condition is that the vector bit budget is above a threshold for additional splits.

14. The method according to claim 12 where an additional condition is that the initial number of splits is below a threshold and/or that a bitrate per sample is above a given limit.

15. A non-transitory, computer readable medium having instructions stored therein which, when executed on at least one processor, causes the at least one processor to perform the method according to claim 10.

16. A media encoder, operable to perform split gain shape vector encoding, where the encoding of each vector segment is subjected to a constraint related to a maximum number of bits, $B_{MAX}$, allowed for encoding a vector segment, the media encoder being configured to:
   for a target vector x:
      determine an initial number, $Np_{\_init}$, of segments for the target vector x;
      determine an average number of bits per segment, $B_{AVG}$, based on a vector bit budget and $Np_{\_init}$; and
      determine a final number of segments to be used in the gain shape vector encoding based on energies of the $Np_{\_init}$ segments and a difference between $B_{MAX}$ and $B_{AVG}$,
      thereby enabling an efficient allocation of the bits of the bit budget over the target vector.

17. The media encoder according to claim 16, being configured to, in order to determine the final number of segments:
   in response to determining that a relation between the energies of the $Np_{\_init}$ segments and the difference between $B_{MAX}$ and $B_{AVG}$ fulfills a criterion:
   increase the number of segments, as compared to the initial number, for the target vector x, for the gain shape vector encoding.

18. The media encoder according to claim 17, being further configured to:
   indicate the increase of the number of segments to a media decoder.

19. The media encoder according to claim 16, being configured to, in order to determine the final number of segments:
   increase the number of segments, as compared to the initial number, for the target vector x, when a maximum deviation, of a target vector segment energy, from an average per-segment energy value, $E_{AVG}$, for the target vector x is larger than a threshold based on the difference between $B_{MAX}$ and $B_{AVG}$.

20. The media encoder according to claim 16, being further configured to:
   indicate the final number of segments to a media decoder.

21. The media encoder according to claim 16, being further configured to determine $B_{AVG}$ and a final number of segments only when at least one additional condition is met.

22. The media encoder according to claim 16, being configured to determine $B_{AVG}$ and a final number of segments when the vector bit budget is above a threshold for additional splits and/or when a bitrate per sample is above a given limit.

23. The media encoder according to claim 16, being configured to determine $B_{AVG}$ and a final number of segments when the initial number of segments is below a threshold.

24. A wireless device comprising a media encoder according to claims 16.

25. A media decoder operable to perform gain shape vector decoding, where a representation of each vector segment of a gain shape vector x is subjected to a constraint related to a maximum number of bits, $B_{MAX}$, allowed for encoding a vector segment; the media decoder being configured to:
   determine an initial number of segments, $Np_{\_init}$, for a vector $x_q$ to be reconstructed;
   receive an indication, from a media encoder, of whether an increased number of segments is applied for the vector $x_q$; and
   determine a final number of segments for the decoding of the vector $x_q$ based on the received indication.

26. The media decoder according to claim 25, being further configured to: decode the vector $x_q$ based on the final number of segments.

27. The media decoder according to claim 25, being further configured to receive the indication only when one or more additional conditions are met.

28. The media decoder according to claim 27, where an additional condition is that the vector bit budget is above a threshold for additional splits.

29. The media decoder according to claim 27, where an additional condition is that the initial number of splits is below a threshold and/or that a bitrate per sample is above a given limit.

30. A wireless device comprising a media decoder according to claim 25.

* * * * *